United States Patent
McVicker et al.

(10) Patent No.: US 10,325,829 B2
(45) Date of Patent: Jun. 18, 2019

(54) TIM STRAIN MITIGATION IN ELECTRONIC MODULES

(71) Applicant: International Business Machines Corporation, Armonk, NY (US)

(72) Inventors: Gerard McVicker, Yorktown Heights, NY (US); Sri M. Sri-Jayantha, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 10 days.

(21) Appl. No.: 15/791,809

(22) Filed: Oct. 24, 2017

(65) Prior Publication Data

US 2018/0047654 A1 Feb. 15, 2018

Related U.S. Application Data

(63) Continuation of application No. 15/161,496, filed on May 23, 2016, now Pat. No. 9,837,332, which is a continuation of application No. 14/189,597, filed on Feb. 25, 2014, now Pat. No. 9,437,519.

(51) Int. Cl.
| | |
|---|---|
| *H01L 23/367* | (2006.01) |
| *H01L 23/04* | (2006.01) |
| *H01L 23/00* | (2006.01) |
| *H01L 23/42* | (2006.01) |

(52) U.S. Cl.
CPC .......... *H01L 23/3675* (2013.01); *H01L 23/04* (2013.01); *H01L 23/041* (2013.01); *H01L 23/562* (2013.01); *H01L 23/42* (2013.01); *H01L 2224/16225* (2013.01); *H01L 2224/32225* (2013.01); *H01L 2224/73204* (2013.01); *H01L 2224/73253* (2013.01); *Y10T 428/24777* (2015.01)

(58) Field of Classification Search
CPC .... H01L 23/36–23/4735; H01L 31/024; H01L 31/052–31/0525; H01L 33/64–33/648
See application file for complete search history.

(56) References Cited

U.S. PATENT DOCUMENTS

| | | | |
|---|---|---|---|
| 6,933,619 B2 | 8/2005 | Caletka et al. | |
| 7,239,517 B2 | 7/2007 | Fitzgerald et al. | |
| 7,372,147 B2 * | 5/2008 | Dai ........................ | H01L 23/40 257/706 |
| 8,269,340 B2 | 9/2012 | Gaynes et al. | |
| 2004/0104458 A1 | 6/2004 | Tsukada et al. | |
| 2014/0138811 A1 | 5/2014 | Pandey et al. | |

OTHER PUBLICATIONS

United States Notice of Allowance dated Jul. 26, 2017 in U.S. Appl. No. 15/161,496.
United States Office Action dated Jun. 14, 2017 in U.S. Appl. No. 15/161,496.

(Continued)

*Primary Examiner* — Hoa B Trinh
(74) *Attorney, Agent, or Firm* — L. Jeffrey Kelly, Esq.; McGinn IP Law Group, PLLC

(57) ABSTRACT

A heat spreading lid, including a lid body, a wing portion, where the wing portion flexibly moves independently from the lid body.

5 Claims, 16 Drawing Sheets

(56) References Cited

OTHER PUBLICATIONS

United States Office Action dated Feb. 8, 2017 in U.S. Appl. No. 15/161,496.
U.S. Notice of Allowance dated May 4, 2016 in U.S. Appl. No. 14/189,597.
U.S. Office Action dated Mar. 17, 2015 in U.S. Appl. No. 14/189,597.
U.S. Office Action dated Sep. 16, 2015 in U.S. Appl. No. 14/189.597.
U.S. Office Action dated Jan. 19, 2016 in U S Appl. No. 14/189,597.

* cited by examiner

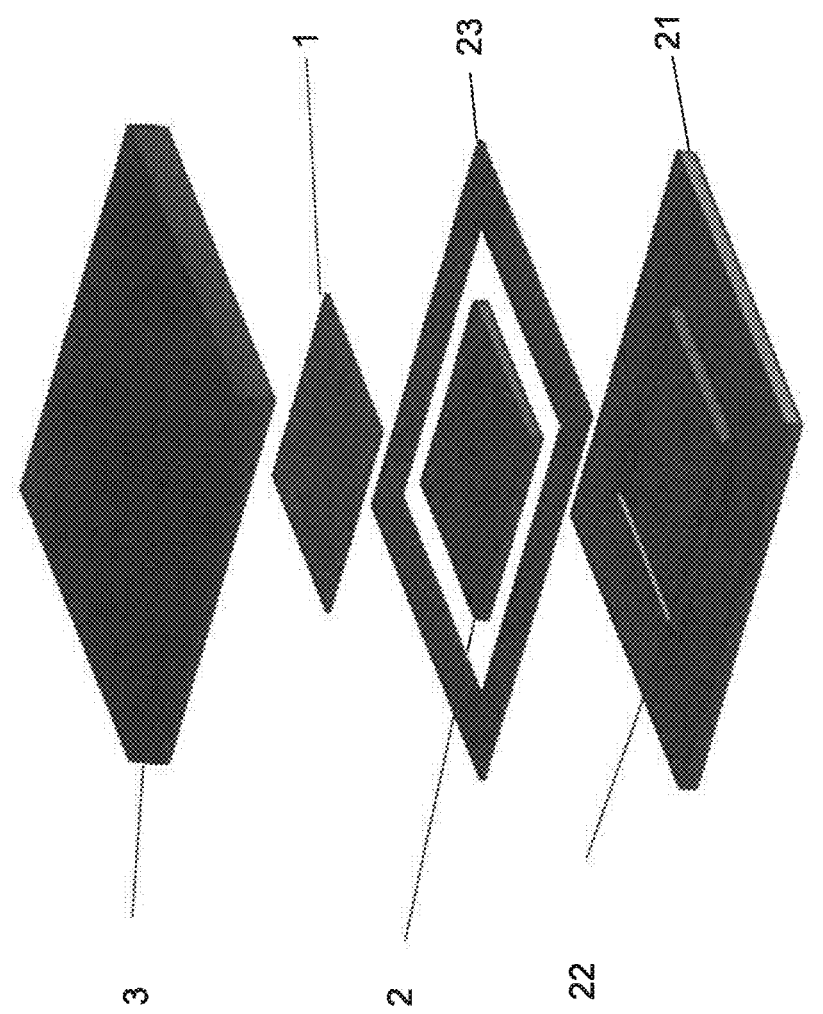

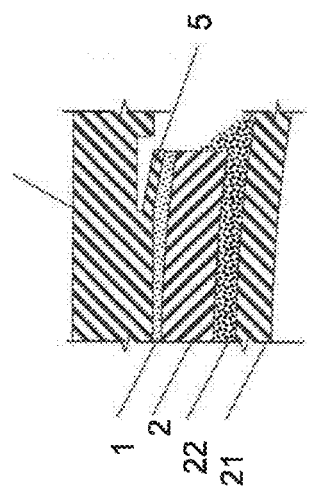
FIGURE 5A
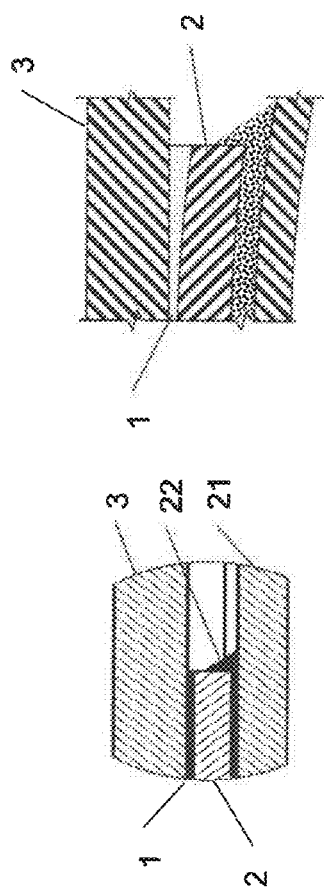
FIGURE 5B
FIGURE 5C
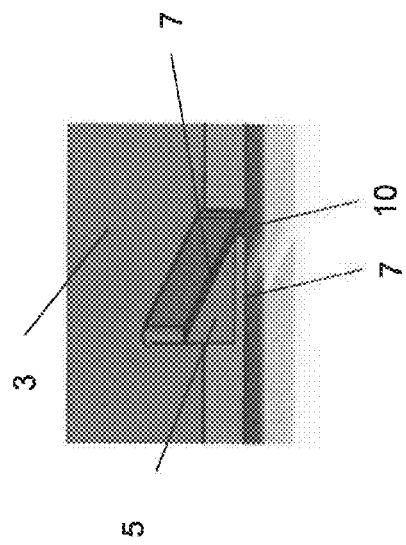
FIGURE 6B
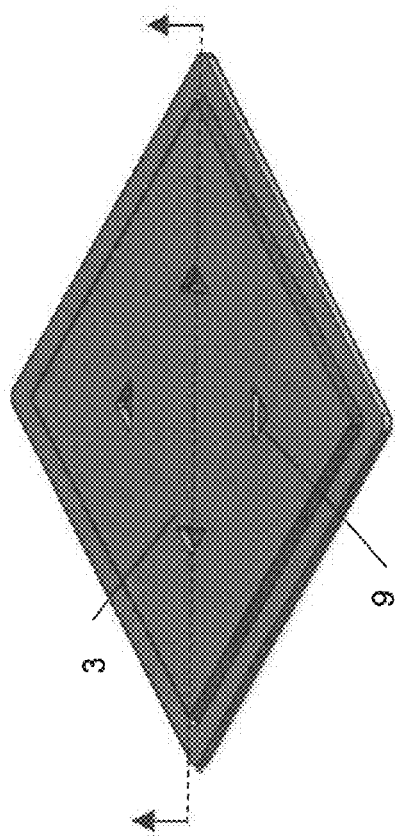
FIGURE 6A

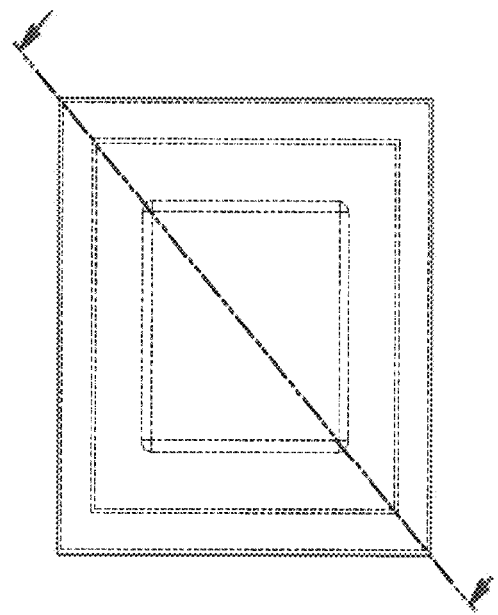
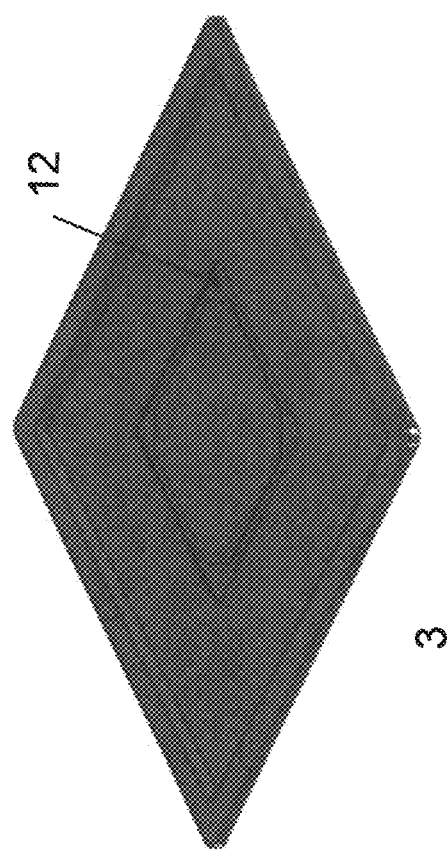
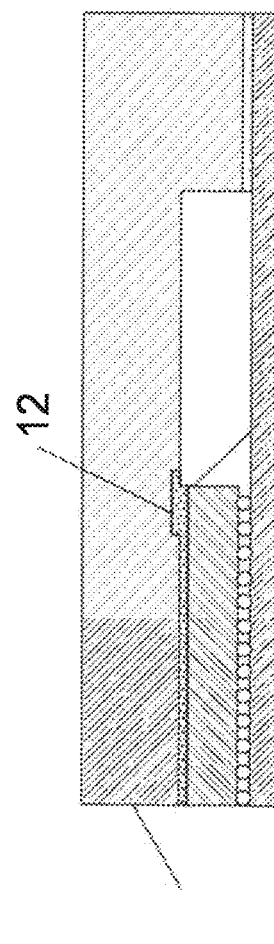
FIGURE 11A
FIGURE 11B
FIGURE 11C

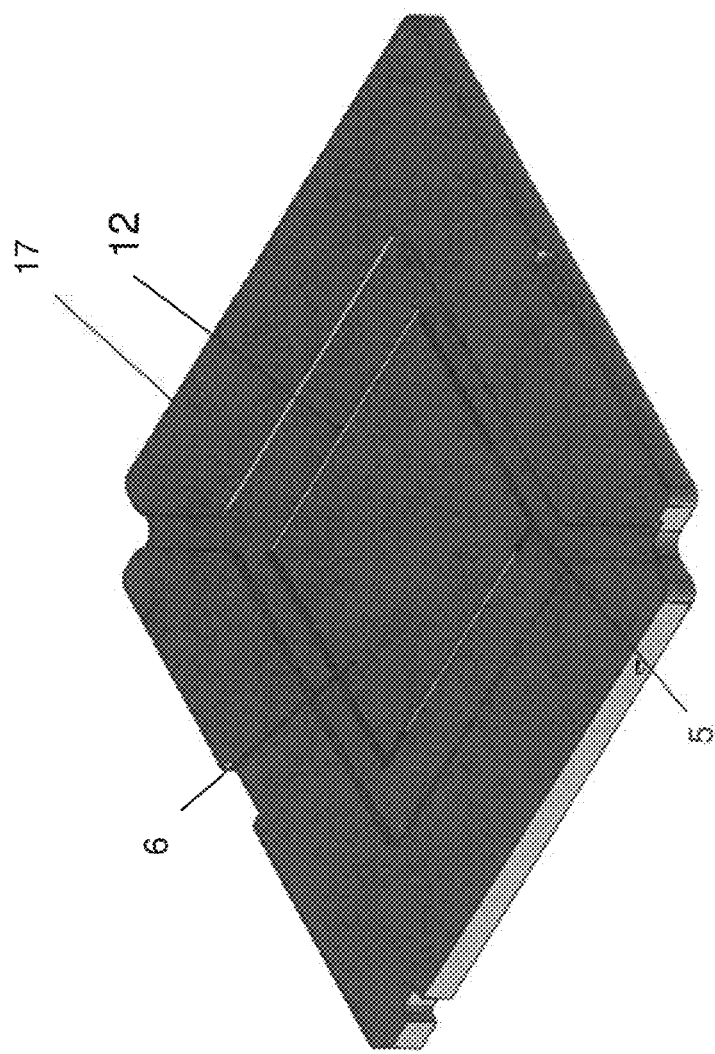

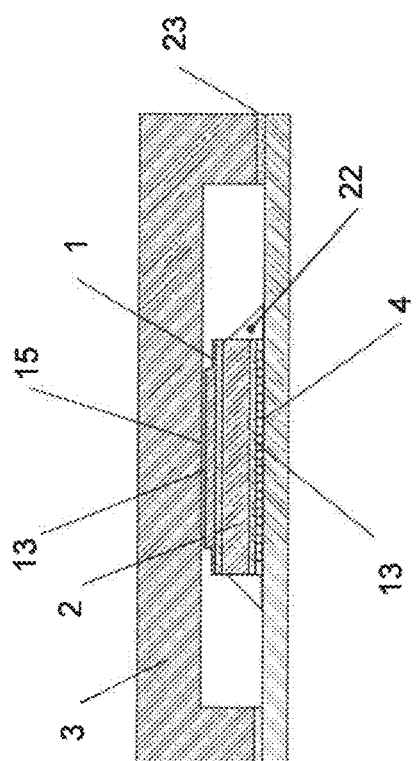
FIGURE 13A
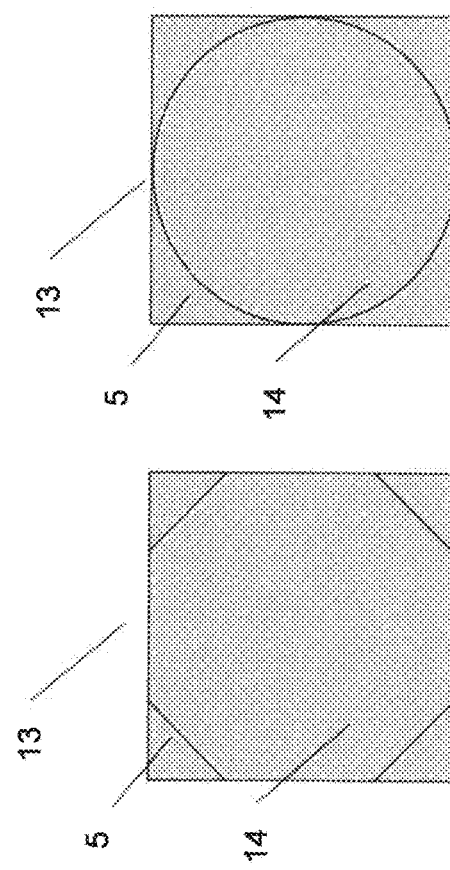
FIGURE 13B
FIGURE 13C
FIGURE 13D

TIM STRAIN MITIGATION IN ELECTRONIC MODULES

CROSS-REFERENCE TO RELATED APPLICATIONS

The present application is a Continuation Application of U.S. patent application Ser. No. 15/161,496, filed on May 23, 2016, which is a Continuation Application of U.S. patent application Ser. No. 14/189,597 filed on Feb. 25, 2014, now U.S. Pat. No. 9,437,519, issued on Sep. 6, 2016, the entire contents of which are hereby incorporated by reference.

DESCRIPTION

Field of the Invention

The present invention generally relates to heat spreading lids for electronic modules. In particular, the invention relates to reducing TIM (thermal interface material) strain in electronic modules through lid designs.

BACKGROUND OF THE INVENTION

Description of the Related Art

TIM (thermal interface material) is used in electronic modules to allow for heat transport from an IC (integrated circuit), referred to as "a die", to a heat spreading component, such as a lid or cooling plate, in order to keep the IC within a specific operating temperature. The TIM material is thermally cured to both the IC and the heat spreading component providing both thermal and mechanical coupling. TIM strain in electronic modules occurs from the CPI (chip package interaction) due to the thermal mechanical coupling resulting from the differential thermal coefficients of integral component (die, controlled collapse chip connection (c4 interconnects), under fill, and organic carrier). CPI occurs during thermal expansion and/or contraction, such as lid assembly curing, accelerated reliability cycling and power on off cycling million, and the organic carrier or circuit card may have a higher coefficient of expansion of seventeen to twenty parts per million. This can lead to the die crowning at certain temperatures where the die will attempt to pull away from the lid and in the process strain the TIM. This can result, for example, in separation of, or cracks in, the TIM at the corners of the die, which can in turn lead to TIM failure. When a TIM failure occurs, it may reduce heat dissipation for the electronic module, which can result in over heating and potential failure of the die.

An increase in lid thickness, which is desirable for improved heat spreading, increases the lid stiffness which lowers lid-to-die compliance and increases TIM strain, leading to a trade off in thermal performance versus TIM reliability. Also, as die areas increase, TIM strain also increases. One technique to mitigate the TIM strain is to minimize the CPI by increasing the thickness and stiffness of the organic carrier core. However, this is a costly adder to the module's overall cost. Newer generations of electronic modules are attempting to reduce costs by eliminating the organic carrier core resulting in increasing CPI and TIM strain. Therefore, innovative solutions to reduce TIM strain while improving thermal performance are needed.

SUMMARY OF THE INVENTION

In view of the foregoing, and other, exemplary problems, drawbacks, and disadvantages of the conventional systems, it is an exemplary aspect of the present invention to provide a lid design which may reduce TIM strain.

Several ways of reducing TIM strain are described. A first method is to strategically modify the heat spreader lid to provide a flexing of the lid which is in contact with the TIM at the location of greatest strain. This occurs typically at the distance from neutral position (DNP), which is normally at the corners of the die. For example, most of the TIM is under compression, however, the TIM transitions to a tensile strain at the corners of the die. A second method of reducing TIM strain is to increase the volume of TIM material strategically at the periphery of the die with emphasis at the DNP.

In a first exemplary aspect of the invention, to achieve the above and other features and purposes, described herein is a heat spreading lid including a lid body and a wing portion having a thermal interface material disposed on the wing portion such that the wing portion flexible moves with the thermal interface material independently from the lid body.

Another exemplary aspect of the invention is a device including a die, a thermal interface material disposed on the die, a heat spreading lid disposed on the thermal interface material opposite the die, the lid including a lid body and a wing portion having a thermal interface material disposed on the wing portion such that the wing portion flexible moves with the thermal interface material independently from the lid body.

Another exemplary aspect of the invention is a device including a die, a thermal interface material disposed on the die, and a heat spreading lid disposed on the thermal interface material opposite the die, the lid including a trench that flexes with the thermal interface material independently from the heat spreading lid.

The above aspects may allow a reduction in TIM strain while allowing the lid thickness to increase and thereby improving thermal performance.

BRIEF DESCRIPTION OF THE DRAWINGS

The foregoing and other purposes, aspects and advantages will be better understood from the following detailed description of exemplary embodiments of the invention with reference to the drawings, in which:

FIG. 1 illustrates an exemplary embodiment of an electronic module;

FIGS. 5A to 5C illustrate a portion of an electronic module at TIM cure temperature and a conventional electronic module and an exemplary embodiment of the invention at room temperature;

FIG. 6A illustrates another exemplary embodiment of a lid and wing feature;

FIG. 6B illustrates a partial section of wing region as indicated in FIG. 6A;

FIGS. 11A to 11C illustrate an embodiment of the invention including a TIM trench;

FIG. 12 illustrates an embodiment of the invention including a cavity region surrounding the die area;

FIG. 13A illustrates an embodiment including a wing pedestal; and

FIGS. 13B-13D illustrate different embodiments of the wing pedestal.

DETAILED DESCRIPTION OF EXEMPLARY EMBODIMENTS OF THE INVENTION

Figure 4A:
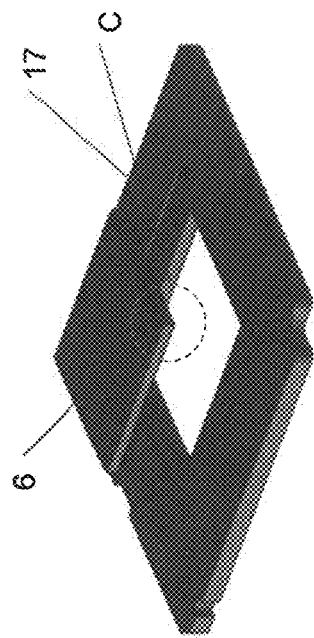
FIG. 4A illustrates an exemplary embodiment of a lid including a lid frame and a lid insert.

Referring now to the drawings, and more particularly to FIGS. 1-13D, there are shown exemplary embodiments of the method and structures according to the present invention.

In high end (business and enterprise) servers, reducing the junction operating temperature of the central processing unit (CPU) module and other high temperature IC components is critical to the life and reliability of the server. A critical component affecting the device junction operating temperature is the TIM 1 (thermal interface material) (see FIG. 1), which allows heat removal from the IC 2 (e.g., a die) to a heat spreading lid 3, thereby lowering the device junction temperature.

From the thermal budget of high end server modules, a reduction of temperature of one or two degrees can have significant benefits to the life and reliability of the module, and therefore the server. Increasing the lid thickness and allowing for increased heat spreading directly lowers the device junction temperature. However, the increased lid thickness also increases the lid stiffness which increases CPI (Chip Package Interaction) resulting in increased TIM strain and tearing, leading in turn to thermal failure. Additionally any increase in CPI can also generate higher coupling stresses which can directly lead to device 2 and/or c4 interconnect 4 cracking and failure.

To mitigate the TIM 1 strain, while increasing lid 3 thickness, reducing CPI, and improving thermal performance, a lid 3 design which features a "thinning" of the lid 3 thickness, strategically at the corners of the die 2, is disclosed. For purposes of further description this "thinned" lid feature is referred to as "winged feature", "winged portion", or "wing design" 5. To demonstrate and teach exemplary benefits of the winged feature 5, a structural finite element model (FEM) of an electronic module was created and subjected to thermal stress conditions which are used in the industry to simulate accelerated thermal cycling (ATC). In addition, a thermal FEM was also created to evaluate the changes in junction temperature for given power and cooling conditions.

FIG. 1 illustrates an exemplary CPU or other electronic module. An organic laminate 21 is connected to a die 2 and includes an under fill 22 between the two. A TIM 1 is disposed between die 2 and lid 3. Lid 3 is sealed to the laminate 21 with seal 23. For this view, the solder interconnects between the die 2 and laminate 21 are not shown.

Figure 2:
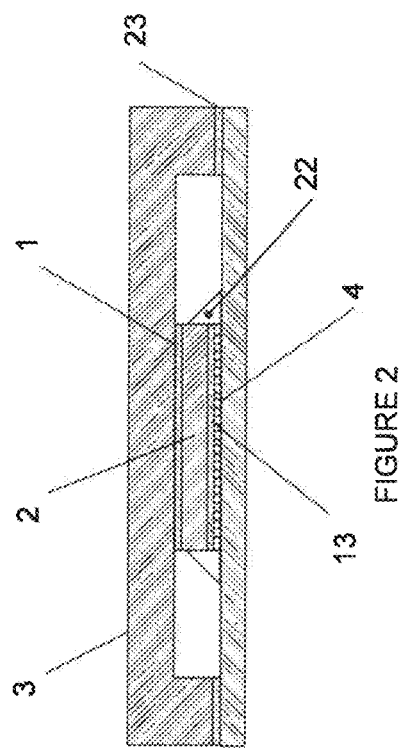
FIG. 2 illustrates a cross section of an exemplary electronic module.

FIG. 2 illustrates a diagonal cross section conventional representation of an electronic module. In this representation, the module components are a 55 mm core-less organic carrier, a 21 mm square under filled silicon die 2, and a conventional 1 mm heat spreading lid 3.

Figure 3A:
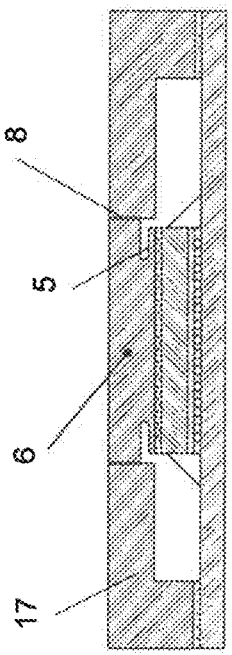
FIG. 3A illustrates a diagonal cross section of an exemplary embodiment of an electronic module having a winged portion.
Figure 3B:
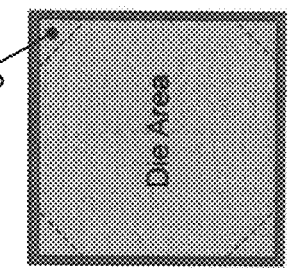
FIG. 3B illustrates a bottom view portion of a lid insert indicating the wing area in the die region.

FIG. 3A represents a diagonal cross-section of an electronic module, similar to that of FIG. 2, with the addition of the winged portion 5 located on insert 6. The means for connecting lid frame 17 to insert 6 is not particularly limited. For instance, insert 6 may be connected to lid frame 17 by a suitable thermal/structural adhesive or solder 8. The inserted winged portion 5 may mirror the die 2 area so as to introduce four winged portions 5 at the DNP. FIG. 3B is a bottom up plan view of the insert 6.

Figure 4B:
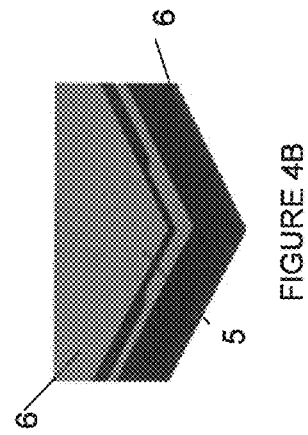
FIG. 4B illustrates a scaled view of the lid insert wing.

FIG. 4A illustrates an insert 6 and the lid frame 17, which together may form lid 3. FIG. 4B is a close up view of a corner of insert 6 at circle C of FIG. 4A. In FIGS. 4A and 4B, the die would be located towards the top of the page and the die-side of insert 6 is the surface facing "up" in the illustration.

FIGS. 5A-5C illustrate a lid 3 at capping temperature, then at a lower temperature without and with a winged portion 5. FIG. 5A illustrates an exemplary module which is stress free at a capping temperature (e.g., 165° C.). FIGS. 5B and 5C illustrate exemplary modules with CPI coupling at room temperature (e.g., 25° C.), at which point the die 2 may deform relative to the lid 3, so as to potentially increase the vertical separation distance from each other at the corner of the die 2.

As can be seen in FIG. 5B, the deformation of the die 2 relative to the lid 3 can cause large vertical or tensile strain on TIM 1, which can result in tearing or failing of the TIM 1. FIG. 5C, however, illustrates that the winged portion 5 is able to deform with the die 2 and thus greatly reduce the amount of strain on the TIM 1, which can reduce the chance of TIM 1 failure and lower thermal resistance.

The winged portion 5 can also be incorporated into the lid 3, for example by machining operations, without the use of an insert 6. FIGS. 6A and 6B show four pockets 9 that are machined to produce a thinned section at the DNP. A slot 10 is machined through at the periphery to allow for wing portion 5 flexing. For instance, because the winged portion 5 is separated from an adjacent portion of the lid 3, the winged portion 5 may vertically move or flex independently of the adjacent portion of the lid 3, and thus may allow movement with the DNP of the die 2 to prevent tearing of the TIM 1. FIG. 6B shows a detailed section of the machined winged portion 5 section.

The winged design introduces a thinned section (e.g., a winged portion 5) of the heat spreading lid 3 over the DNP area of the die 2. Under CPI, the winged portion 5 acts as a flexible member with lower stiffness than the main body of the lid 3. This stiffness reduction allows the winged portion 5 to flex in contour with the die 2 and therefore reduces the vertical strain of the TIM 1. This is in contrast with conventional designs, where the lid 3 stays relatively straight and the contouring of the die 2 forces a large vertical strain on the TIM 1.

The winged portion 5 may have an edge(s) 7 which is disconnected from the adjacent portion of the lid 3. This can allow the winged portion 5 to move independently from the adjacent portion of the lid 3. This also may allow the winged portion 5 to flex independently of the portions of the lid 3 which are adjacent the edges 7. A portion of the lid 3 may also be arranged above the winged portion 5, on a side of the winged portion opposite the die 2 (e.g., see FIG. 4B). The winged portion 5 is located on a die 2 side of the lid 3. While the winged portion 5 has been illustrated in FIG. 6B as a triangle with two edges 7, the winged portion 5 can also be formed in other shapes, such as an arc, structures including additional edges, etc.

Figure 7A:
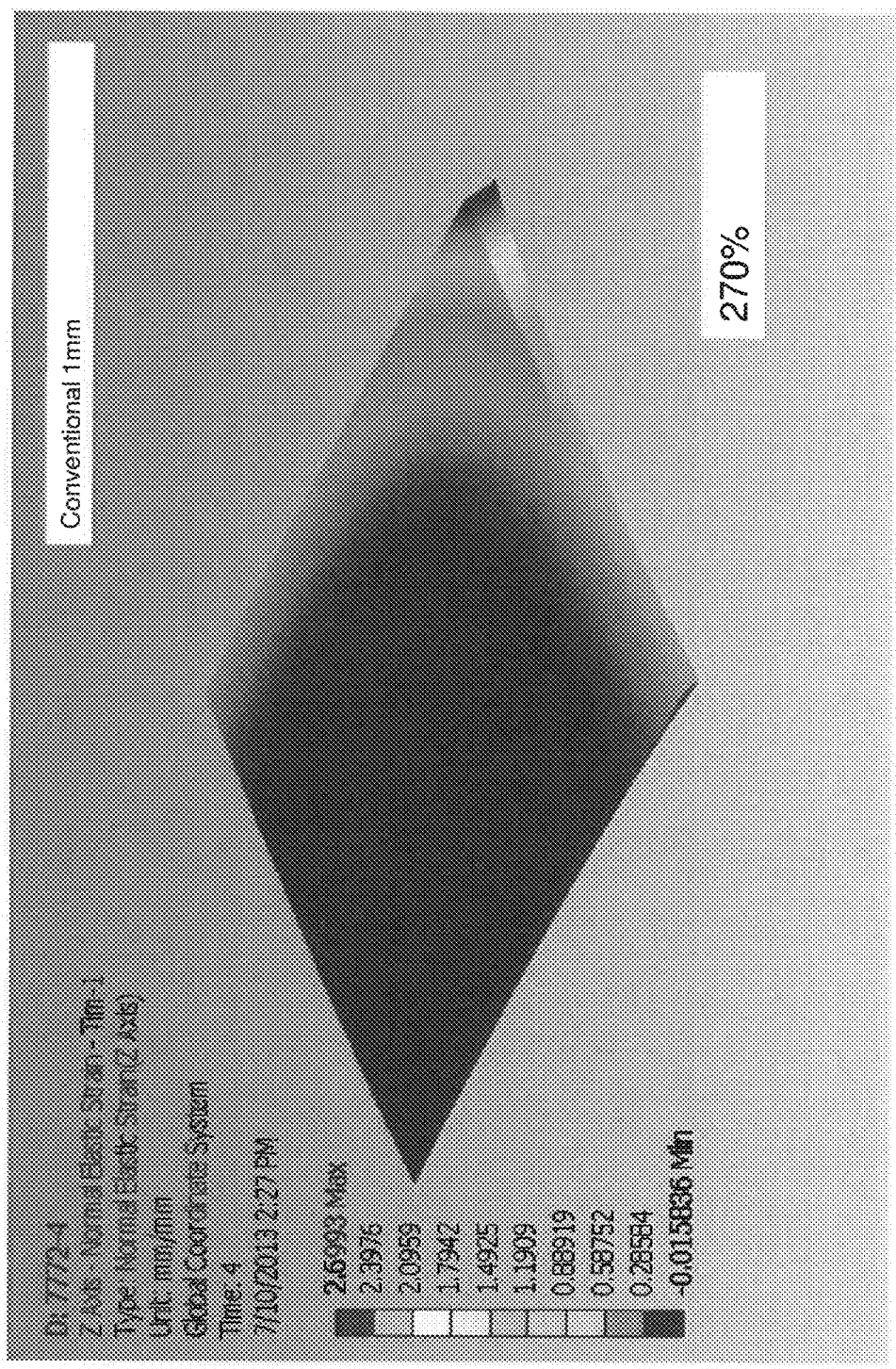
FIGS. 7A to 7D illustrate modeled TIM vertical strain for 1 mm and 2 mm thick lids with and without a winged portion.
Figure 7B:
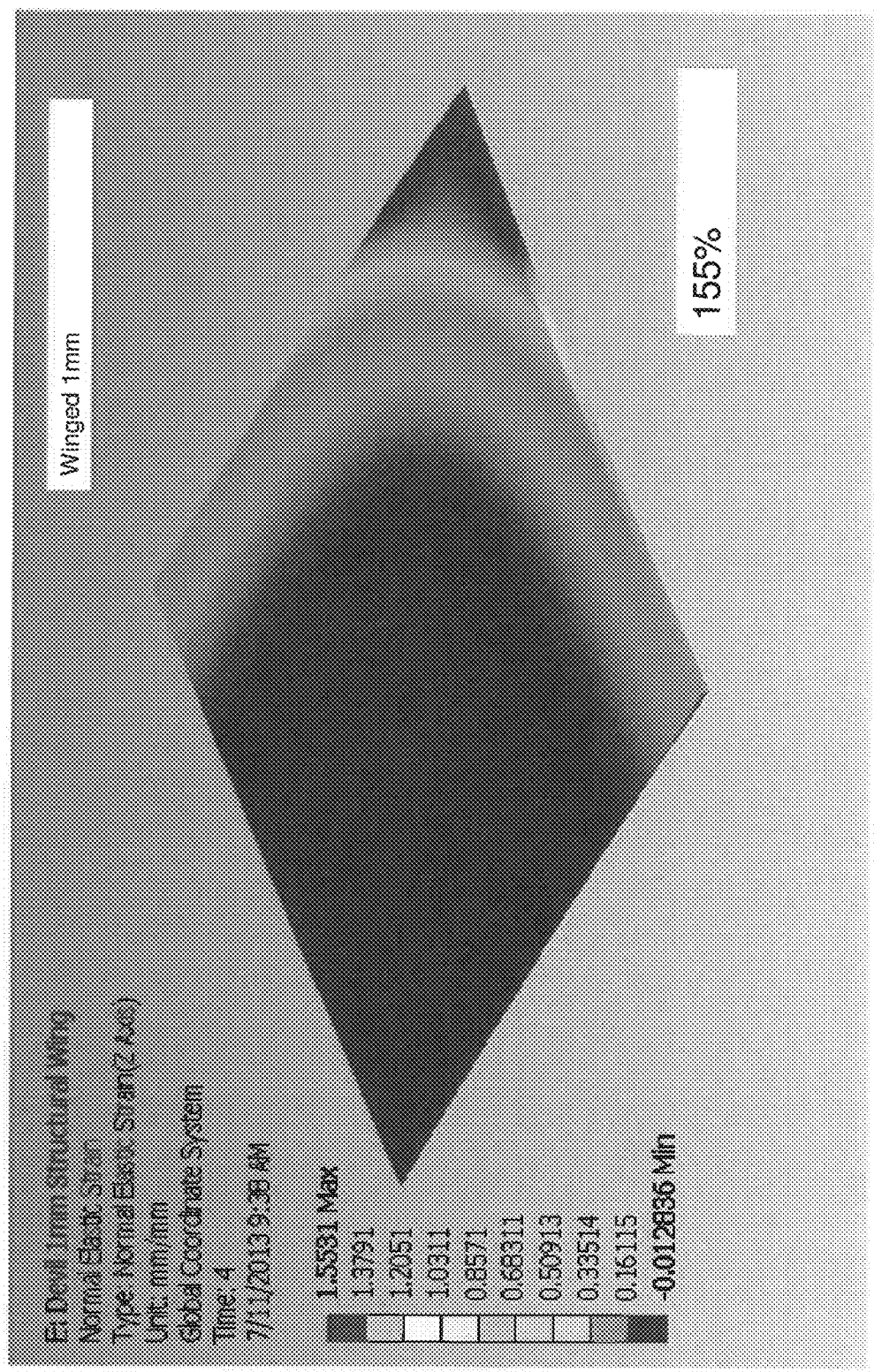

FIGS. 7A and 7B report TIM strain results from the thermal mechanical modeling exercise for a conventional 1 mm lid versus a winged 1 mm lid, clearly indicating the wing design results in 42% lower TIM strain. It is noted that FIGS. 7A-8D illustrate one corner of the lid. For the purposes of modeling, it can be assumed the four corners of the lid would behave the same (e.g., symmetrically).

To compare the change in TIM strain as the lid thickness is increased, 2 mm conventional and 2 mm winged designs were analyzed, and results for TIM strain and die device layer stress were recorded. The maximum shear stress for the device layer is used as an indicator of CPI interconnects failure.

Figure 7C:
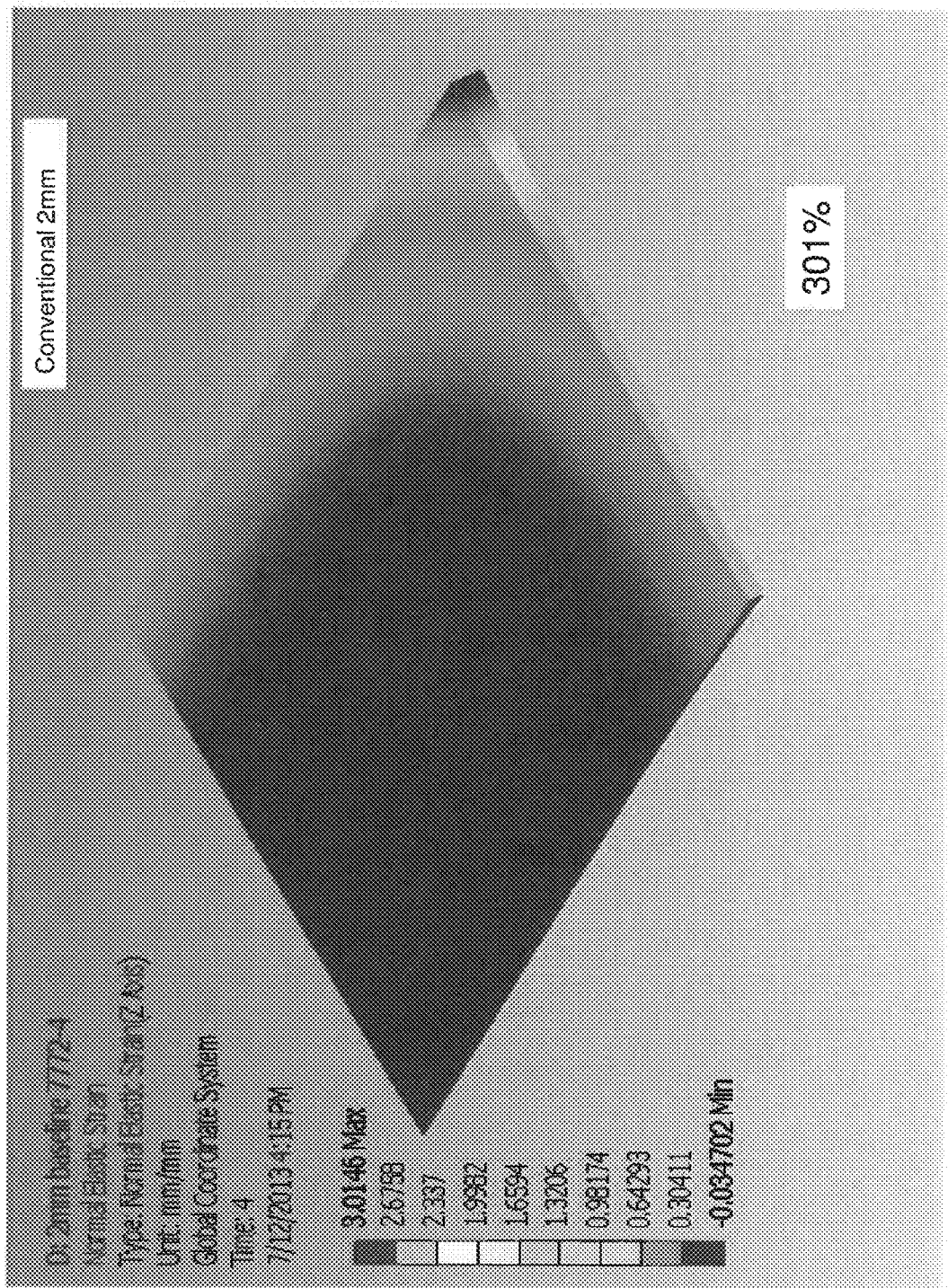
Figure 7D:
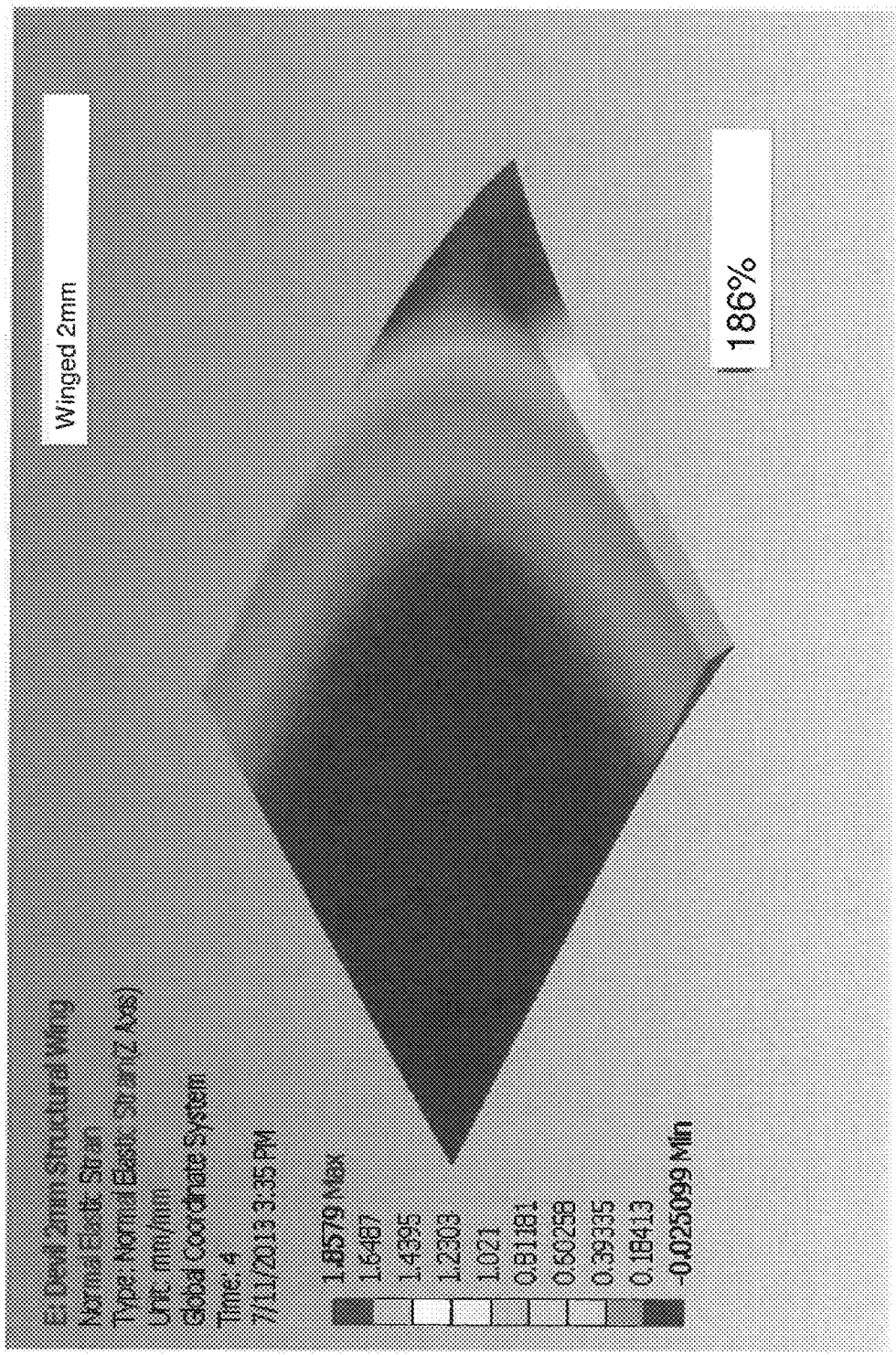
Figure 8A:
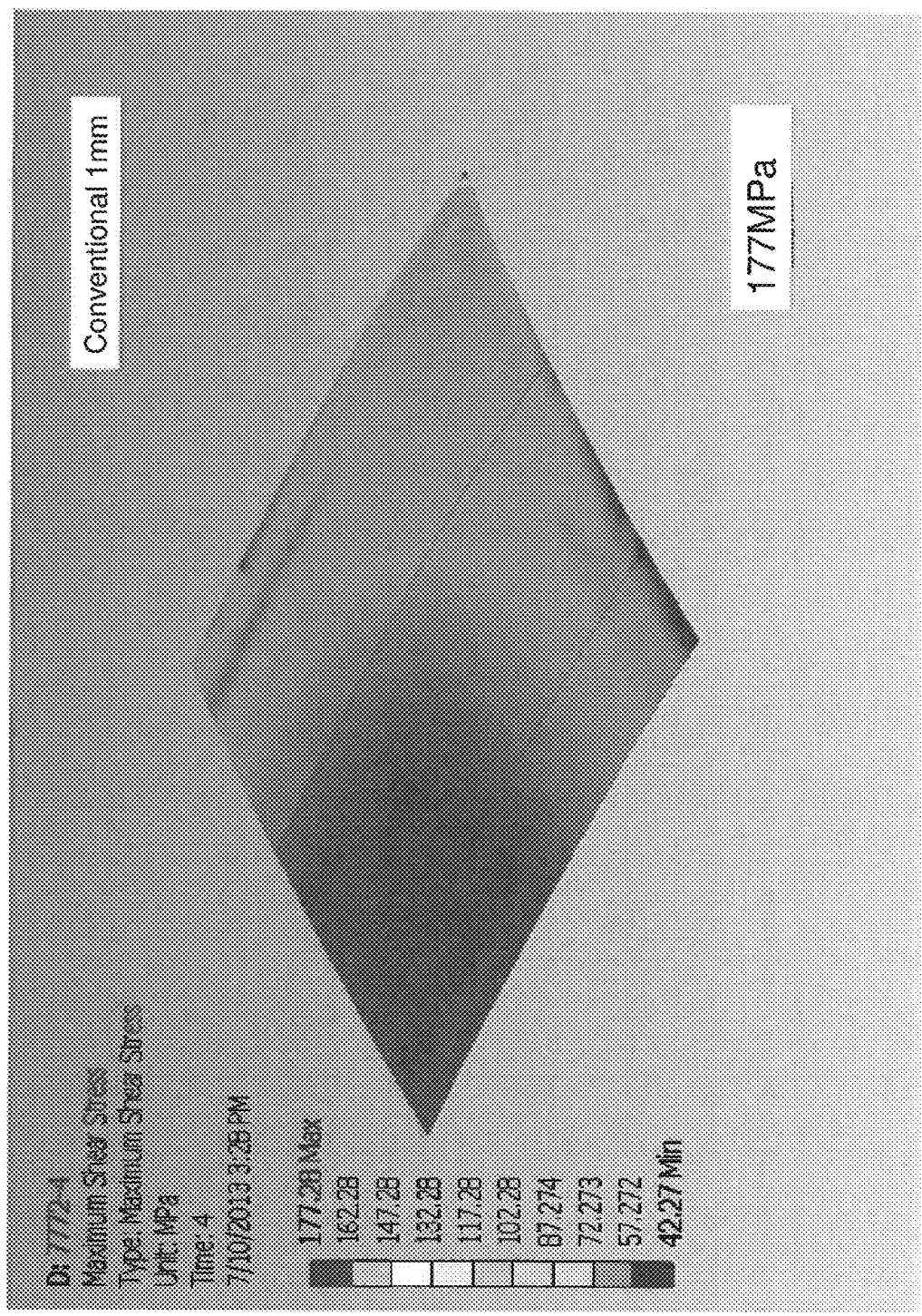
FIGS. 8A to 8D illustrate modeled BEOL (back end of line) maximum shear stress for 1 mm and 2 mm thick lids with and without a winged portion.
Figure 8B:
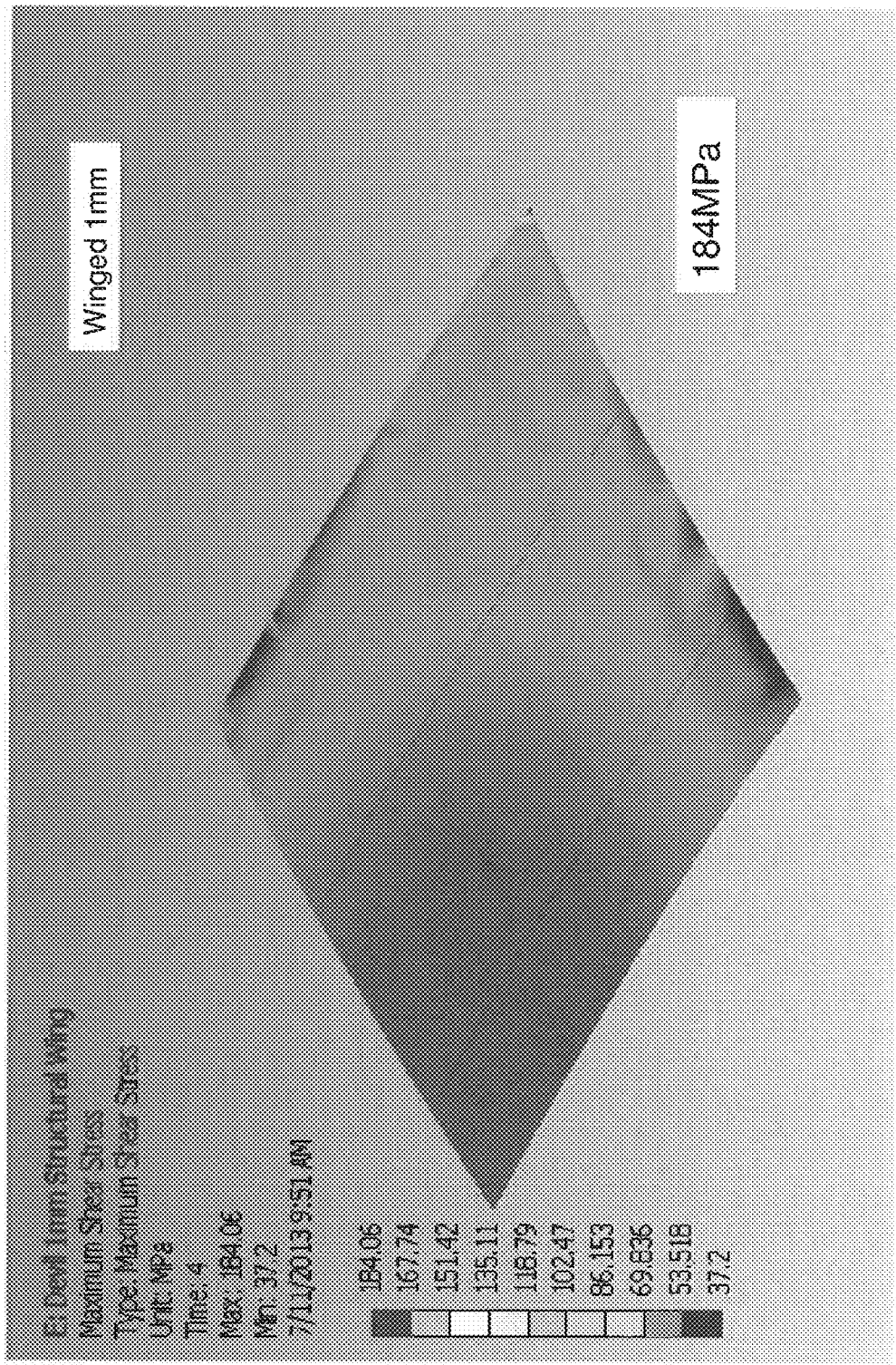
Figure 8C:
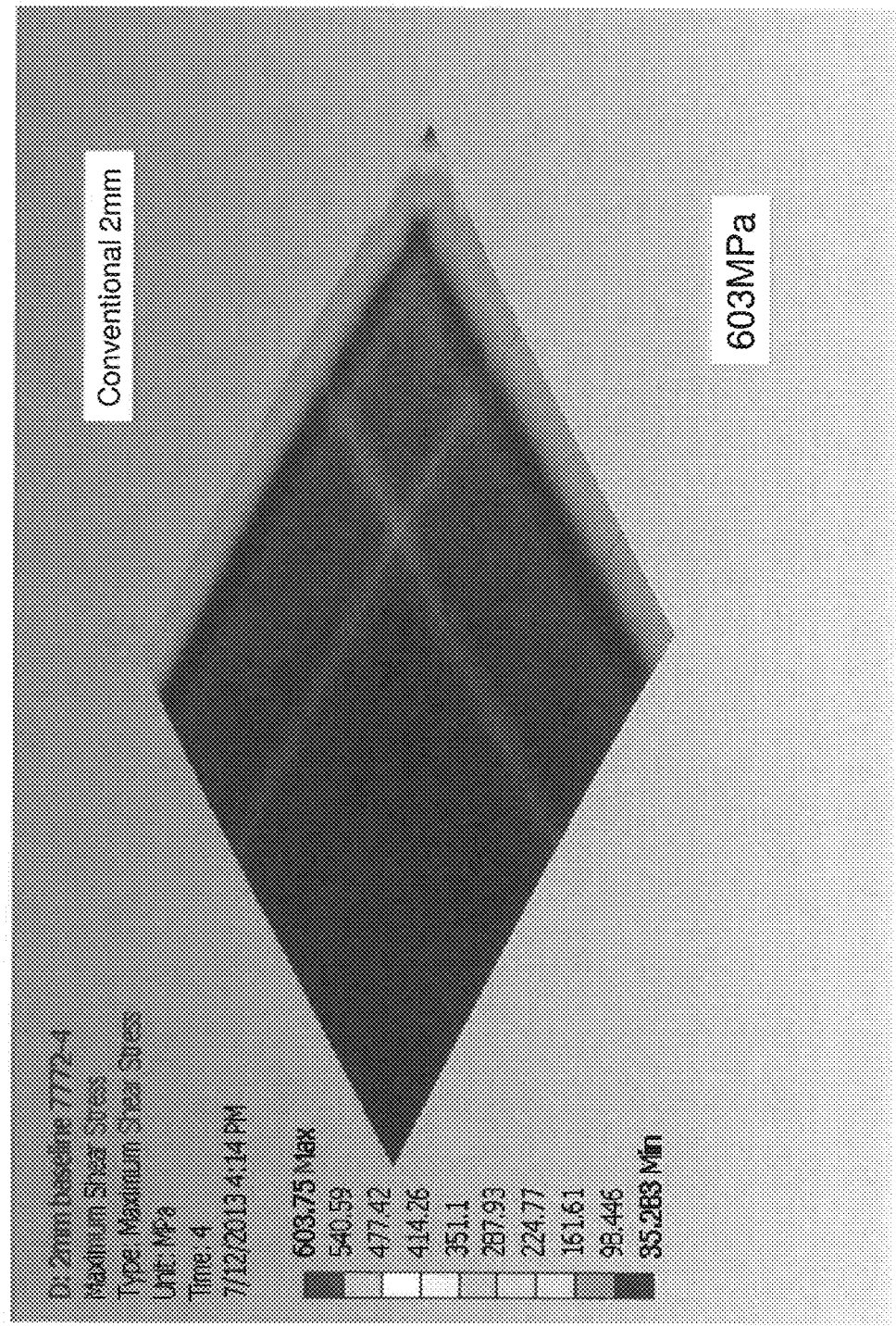
Figure 8D:
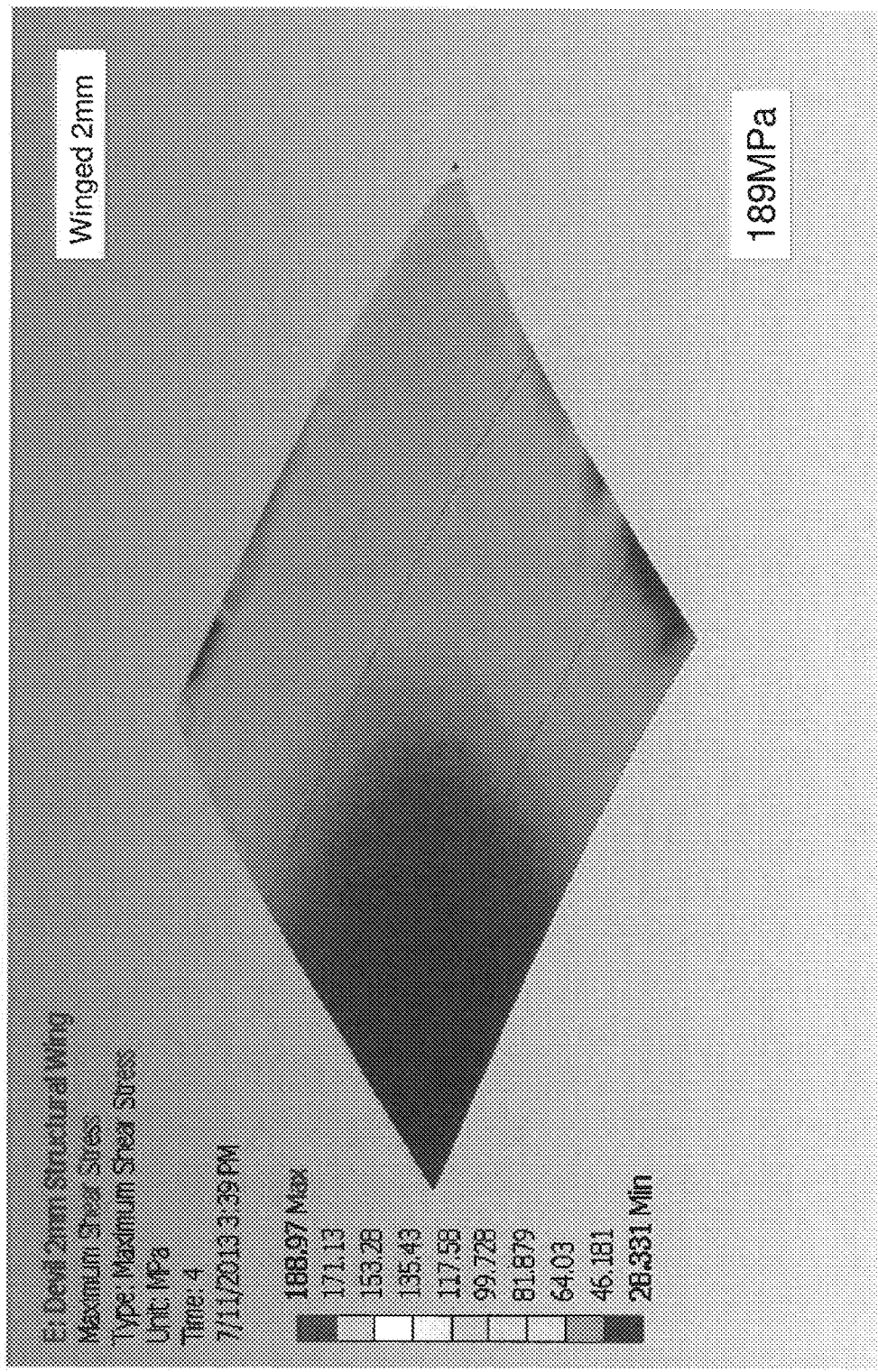

FIGS. 7C to 7D report TIM strain results and indicate that even by increasing the lid thickness but using a winged design, the TIM strain is still reduce from that of a conventional 1 mm lid by 31%.

FIGS. 8A to 8D report the maximum shear stress in the device layer. Comparing the conventional designs, one can see that the maximum shear stress goes up dramatically (177 MPa->603 MPa) as the lid thickness doubles. This increase in shear stress significantly impacts the reliability of the device layer interconnects and leads to interconnect 4 failure. This failure has limited the increase in heat spreader lid 3 thickness and therefore thermal improvement.

When the 1 mm winged design is compared to the 1 mm conventional design, there is only a slight increase (177 MPa->184 MPa.) in shear stress. However, in the 2 mm winged design, there is only a small increase (189 MPa) in shear stress in comparison to the 1 mm conventional or winged designs, but there is a large difference between the 2 mm conventional design (603 MPa) and the 2 mm winged design (189 MPa). Therefore, it can be concluded that moving from a 1 mm conventional lid design to a 2 mm winged design reduces TIM strain while not negatively impacting c4 interconnect reliability.

Figure 9A:
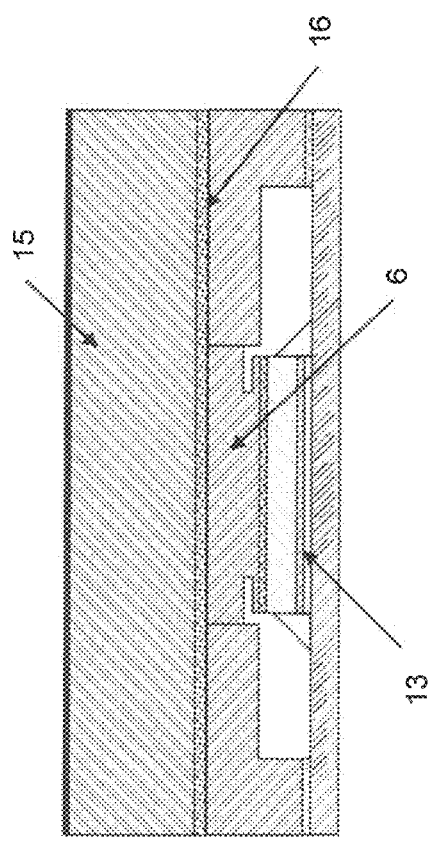
FIG. 9A illustrates an exemplary electronic module with secondary TIM2 and cold plate for thermal modeling with constant temperature and core hot-spots.
Figure 9B:
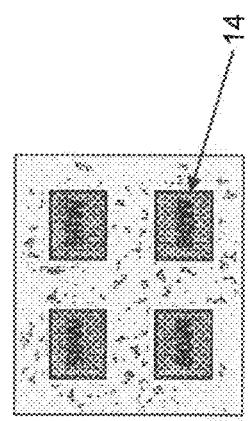
FIG. 9B illustrates die area with core region hot spots for thermal modeling.

FIG. 9A is a schematic view of the thermal model used to evaluate the thermal benefits of an increase of lid thickness, while incorporating the winged design. Models were run for all four previously described design points using power inputs at the active device layer 13 of 200 W uniform and processor core power, or hot spots 14, of 50 W at four locations. FIG. 9B is a schematic floor plan of device core power. A 3 mm heat spreader 15 was added and well as a second TIM 16 and a 25° C. temperature boundary condition to the top surface of the heat spreader 15. Temperature plots of all four design points were compared for both uniform and hot spot power.

Figure 10A:
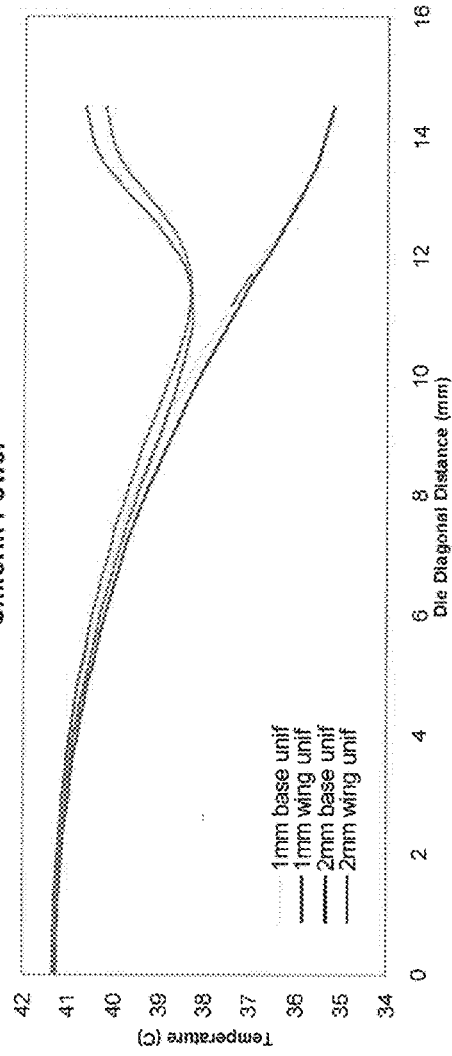
FIGS. 10A and 10B illustrate thermal modeling results of temperature in relation to die diagonal distance with conventional and winged designs for uniform and hot spot power inputs.

Results for uniform power are presented in temperature plot FIG. 10A. As can be seen, the variation in maximum temperature is insignificant. In addition, while there is a spike in temperature around the wing portion 5, the addition of the wing does not compromise the maximum temperature.

Figure 10B:
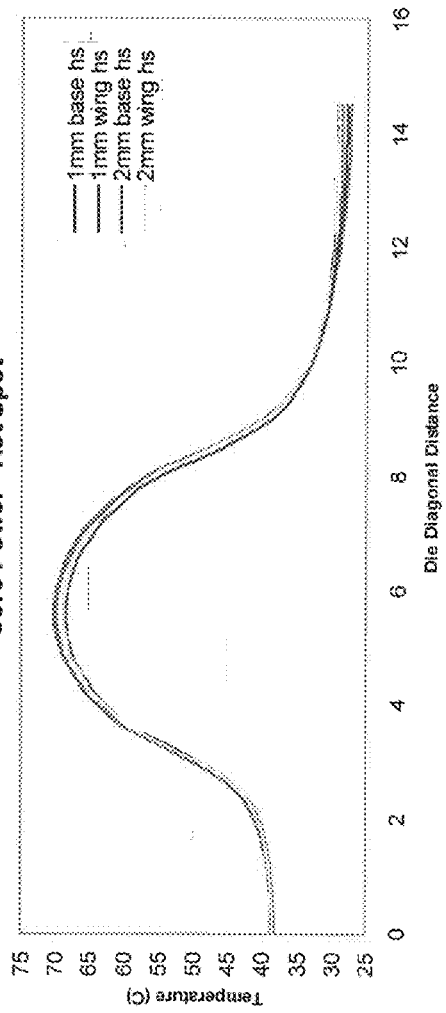

Results for the Core Hot-Spot power are presented in temperature plot FIG. 10B. A maximum temperature drop of 1.4 degrees C. is realized between the 1 mm conventional lid and the 2 mm conventional lid. However, it must be noted that a temperature drop of 1 degree C. is realized for the 2 mm winged design.

Therefore, as can be determined from the results of the modeling exercise, the introduction of a winged design into the 1 mm the heat spreading lid can result in lower TIM strain, without compromising CPI. When the winged design is incorporated into a 2 mm lid design, a 1 degree C. drop in temperature is gained along with reduced TIM strain, again without compromising CPI. Further, as the core power density increases, the resulting temperature drop will improve through the use of the wing design.

FIGS. 11A and 11B illustrate another method to mitigate TIM strain. A cavity or channel 12 may be machined into the lid 3 along the periphery of the die 2 shadow. This channel 12 allows for an increase of the TIM 1 at the DNP and edges of the die 2. By increasing the thickness of the TIM 1, for the same CPI-induced warping of the die 2, the strain can be effectively decreased in direct proportion to the thickness.

FIG. 11A shows a bottom view depiction of an increased TIM receiving cavity 12 in lid 3. FIG. 11B shows a schematic diagonal cross section of the increased TIM 1.

Although the increased TIM receiving cavity 12 can directly mitigate the vertical TIM 1 strain, it does not reduce the CPI-induced stress or allow for improved thermal performance by increasing the lid 3 thickness. However, reducing the TIM 1 strain in itself is critical to the overall thermal performance, as it relieves potential TIM 1 tearing.

In addition, thermal performance should not be impacted negatively as most heat spreading is done towards the middle of the die 2, due to the adiabatic condition at the edge of the TIM 1/Die 2 interface. The TIM cavity 12 method described here can be directly utilized as a standalone feature to reduce TIM 1 strain in a conventional lid 3, or it can be used to augment the a design including a winged portion 5, by providing strain mitigation around the periphery of the die 2, as can be seen in exemplary FIG. 12.

As illustrated in exemplary FIG. 13A, a further embodiment includes wing pedestal 13 which includes a pedestal base 14 and a winged portion 5. Wing pedestal 13 is disposed on die 2 with TIM 1 disposed there between. Winged pedestal 13 is attached to lid 3 through the use of a high conductivity metal interface 15 which is disposed there between. The high conductivity metal interface 15 can be formed of solder, or any other suitable material. The use of wing pedestal 13 can simplify the machining process and allow greater variation of the winged portions 5. FIG. 13B illustrates a winged pedestal 13 having triangular winged portions 5. FIG. 13C illustrates a winged pedestal with a circular interface between the winged portion 5 and the winged pedestal base 14. FIG. 13D illustrates another embodiment which includes serrated wing portions 5, which can provide even lower stiffness.

While the above examples refer to processors, such as a CPU, the invention can be applied to any electronic module where a CPI mismatch occurs, such as power components, other processors, etc.

While the invention has been described in terms of exemplary embodiments, those skilled in the art will recognize that the invention can be practiced with modification within the spirit and scope of the appended claims.

Further, it is noted that, Applicant's intent is to encompass equivalents of all claim elements, even if amended later during prosecution.

What is being claimed:

1. A device comprising:
    a die;
    a thermal interface material disposed on the die;
    a heat spreading lid disposed on the thermal interface material opposite the die, the lid comprising:

a lid body; and a wing portion disposed at a corner of the lid body;

wherein the wing portion flexibly moves independently from the lid body, and wherein the wing portion is connected to a wing pedestal, the wing pedestal being disposed between the lid body and die.

2. The device according to claim 1, wherein a gap is formed between the wing portion and a portion of the lid body above the lid portion.

3. The device according to claim 1, wherein the lid body comprises a lid insert and a lid frame in which the lid insert is disposed, and wherein the wing portion comprises an edge portion of the lid insert.

4. The device according to claim 1, wherein the wing portion is serrated.

5. The device according to claim 1, wherein the lid includes a plurality of ones of the wing portion, and further comprising a trench extending between two adjacent wing portions.

\* \* \* \* \*